United States Patent
Zheng et al.

(10) Patent No.: US 6,911,136 B2
(45) Date of Patent: Jun. 28, 2005

(54) METHOD FOR REGULATING THE ELECTRICAL POWER APPLIED TO A SUBSTRATE DURING AN IMMERSION PROCESS

(75) Inventors: Bo Zheng, San Jose, CA (US); Rajeev Bajaj, Fremont, CA (US); Zhonghui Alex Wang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 140 days.

(21) Appl. No.: 10/135,546

(22) Filed: Apr. 29, 2002

(65) Prior Publication Data

US 2003/0201166 A1 Oct. 30, 2003

(51) Int. Cl.$^7$ ............................................. C25D 21/12
(52) U.S. Cl. .......................... 205/82; 205/81; 205/134
(58) Field of Search ........................... 205/134, 82, 81; 204/228.7, 228.8

(56) References Cited

U.S. PATENT DOCUMENTS

| | | |
|---|---|---|
| 2,742,413 A | 4/1956 | Cransberg et al. |
| 2,882,209 A | 4/1959 | Brown |
| 3,627,661 A | 12/1971 | Gordon et al. |
| 3,649,509 A | 3/1972 | Morawetz et al. |
| 3,727,620 A | 4/1973 | Orr |
| 3,770,598 A | 11/1973 | Creutz |
| 4,027,686 A | 6/1977 | Shortes et al. |
| 4,065,374 A | 12/1977 | Asami et al. |
| 4,092,176 A | 5/1978 | Kozai et al. |
| 4,110,176 A | 8/1978 | Creutz et al. |
| 4,113,492 A | 9/1978 | Sato et al. |
| 4,120,759 A | 10/1978 | Asami et al. |
| 4,129,480 A * | 12/1978 | Robert .................... 205/790.5 |
| 4,315,059 A | 2/1982 | Raistrick et al. |
| 4,326,940 A | 4/1982 | Eckles et al. |
| 4,336,114 A | 6/1982 | Mayer et al. |
| 4,376,685 A | 3/1983 | Watson |
| 4,396,467 A | 8/1983 | Anthony |
| 4,405,416 A | 9/1983 | Raistrick et al. |
| 4,428,815 A | 1/1984 | Powell et al. |
| 4,435,266 A | 3/1984 | Johnston |
| 4,489,740 A | 12/1984 | Rattan et al. |
| 4,496,436 A | 1/1985 | Inoue |
| 4,510,176 A | 4/1985 | Cuthbert et al. |
| 4,518,678 A | 5/1985 | Allen |
| 4,519,846 A | 5/1985 | Aigo |
| 4,693,805 A | 9/1987 | Quazi |
| 4,732,785 A | 3/1988 | Brewer |

(Continued)

FOREIGN PATENT DOCUMENTS

| | | | | |
|---|---|---|---|---|
| EP | 1 160 846 | 12/2001 | ......... | H01L/21/288 |
| JP | 520 563 69 | 9/1977 | ............ | C25D/5/02 |
| JP | 58182823 | 10/1983 | | |

(Continued)

OTHER PUBLICATIONS

Singer, "Wafer Processing," Semiconductor International Jun. 1998.

(Continued)

*Primary Examiner*—Roy King
*Assistant Examiner*—Harry D. Wilkins, III
(74) *Attorney, Agent, or Firm*—Moser, Patterson & Sheridan

(57) ABSTRACT

A method and apparatus for providing a uniform current density across an immersed surface of a substrate during an immersion process. The method includes the steps of determining a time varying area of an immersed portion of the substrate during the immersion process, and supplying a time varying current to the substrate during the immersion process, wherein the time varying current is proportional to the time varying area and is configured to provide a constant current density to the immersed portion of the substrate.

35 Claims, 3 Drawing Sheets

U.S. PATENT DOCUMENTS

| | | | |
|---|---|---|---|
| 4,789,445 A | 12/1988 | Goffman et al. | |
| 4,869,971 A | 9/1989 | Nee et al. | |
| 4,891,106 A | 1/1990 | Domnikov | |
| 4,898,647 A | 2/1990 | Luce et al. | |
| 5,039,381 A | 8/1991 | Mullarkey | |
| 5,055,425 A | 10/1991 | Leibovitz et al. | |
| 5,092,975 A | 3/1992 | Yamamura et al. | |
| 5,155,336 A | 10/1992 | Gronet et al. | |
| 5,162,260 A | 11/1992 | Leibovitz et al. | |
| 5,178,813 A | 1/1993 | Akatsu et al. | |
| 5,222,310 A | 6/1993 | Thompson et al. | |
| 5,224,504 A | 7/1993 | Thompson et al. | |
| 5,230,743 A | 7/1993 | Thompson et al. | |
| 5,252,807 A | 10/1993 | Chizinsky | |
| 5,256,274 A | 10/1993 | Poris | |
| 5,259,407 A | 11/1993 | Tuchida et al. | |
| 5,290,361 A | 3/1994 | Hayashida et al. | |
| 5,302,256 A | 4/1994 | Miura et al. | |
| 5,316,974 A | 5/1994 | Crank | |
| 5,328,589 A | 7/1994 | Martin | |
| 5,349,978 A | 9/1994 | Sago et al. | |
| 5,368,711 A | 11/1994 | Poris | |
| 5,377,708 A | 1/1995 | Bergman et al. | |
| 5,384,640 A | 1/1995 | Wong | |
| 5,415,890 A | 5/1995 | Kloiber et al. | |
| 5,429,733 A | 7/1995 | Ishida | |
| 5,447,615 A | 9/1995 | Ishida | |
| 5,454,930 A | 10/1995 | Miura et al. | |
| 5,516,412 A | 5/1996 | Andricacos et al. | |
| 5,516,414 A | 5/1996 | Glafenhein et al. | |
| 5,528,118 A | 6/1996 | Lee | |
| 5,608,943 A | 3/1997 | Konishi et al. | |
| 5,625,170 A | 4/1997 | Poris | |
| 5,651,865 A | 7/1997 | Sellers | |
| 5,670,034 A | 9/1997 | Lowery | 205/143 |
| 5,705,223 A | 1/1998 | Bunkofske | |
| 5,723,028 A | 3/1998 | Poris | |
| 5,730,890 A | 3/1998 | Bickford et al. | |
| 5,838,121 A | 11/1998 | Fairbairn et al. | |
| 5,885,469 A | 3/1999 | Kholodenko et al. | |
| 6,024,856 A | 2/2000 | Haydu et al. | |
| 6,071,388 A | 6/2000 | Uzoh | |
| 6,074,544 A | 6/2000 | Reid et al. | |
| 6,093,291 A | 7/2000 | Izumi et al. | |
| 6,113,771 A | 9/2000 | Landau et al. | |
| 6,133,061 A | 10/2000 | Sonoda | 438/69 |
| 6,162,344 A | 12/2000 | Reid et al. | 205/157 |
| 6,174,425 B1 | 1/2001 | Simpson et al. | |
| 6,197,181 B1 | 3/2001 | Chen | |
| 6,203,582 B1 | 3/2001 | Berner et al. | |
| 6,203,684 B1 | 3/2001 | Taylor et al. | |
| 6,210,555 B1 | 4/2001 | Taylor et al. | |
| 6,224,737 B1 | 5/2001 | Tsai et al. | |
| 6,251,236 B1 | 6/2001 | Stevens | |
| 6,254,760 B1 | 7/2001 | Shen et al. | |
| 6,258,220 B1 | 7/2001 | Dordi et al. | 204/198 |
| 6,261,433 B1 | 7/2001 | Landau | |
| 6,261,733 B1 | 7/2001 | Coppens et al. | |
| 6,267,853 B1 | 7/2001 | Dordi et al. | |
| 6,277,263 B1 | 8/2001 | Chen | |
| 6,290,833 B1 | 9/2001 | Chen | |
| 6,303,014 B1 | 10/2001 | Taylor et al. | |
| 6,319,384 B1 | 11/2001 | Taylor et al. | |
| 6,340,633 B1 | 1/2002 | Lopatin et al. | |
| 6,344,419 B1 | 2/2002 | Forster et al. | |
| 6,350,366 B1 | 2/2002 | Landau et al. | |
| 6,391,166 B1 | 5/2002 | Wang | |
| 6,395,101 B1 | 5/2002 | Scranton et al. | |
| 6,399,479 B1 | 6/2002 | Chen et al. | |
| 6,409,903 B1 | 6/2002 | Chung et al. | |
| 6,423,636 B1 | 7/2002 | Dordi et al. | |
| 6,432,821 B1 | 8/2002 | Dubin et al. | 438/678 |
| 6,432,832 B1 | 8/2002 | Miller et al. | |
| 6,440,291 B1 | 8/2002 | Henri et al. | |
| 6,551,484 B2 | 4/2003 | Hey et al. | |
| 6,551,488 B1 | 4/2003 | Chen et al. | |
| 6,565,729 B2 | 5/2003 | Chen | |
| 6,632,345 B1 | 10/2003 | Chen et al. | |
| 6,638,410 B2 | 10/2003 | Chen et al. | |
| 2001/0015321 A1 | 8/2001 | Reid et al. | |

FOREIGN PATENT DOCUMENTS

| | | |
|---|---|---|
| JP | 63118093 | 5/1988 |
| JP | 04280993 | 10/1992 |
| JP | 06-17291 | 1/1994 |
| JP | 04-141395 | 5/1994 |
| JP | 53086580 | 7/1998 |
| WO | 97/12079 | 4/1997 |
| WO | 99/25902 | 5/1999 |
| WO | 99/25903 | 5/1999 |
| WO | 99/25904 | 5/1999 |
| WO | 99/25905 | 5/1999 |
| WO | 99/26275 | 5/1999 |
| WO | 99/47731 A1 | 9/1999 |
| WO | 99/54527 A2 | 10/1999 |
| WO | 01/90446 | 11/2001 |

OTHER PUBLICATIONS

Pitney, K.E., "NEY Contact Manual," Electrical Contacts for Low Energy Uses, The J. M. Ney Co., Bloomfield, Conneticut, 1973, pp. 1–13, 88–91, and 148–165.

Singer, P., "Tantalum, Copper and Damascene: The Future of Interconnects," Semiconductor International, Jun. 1998, 6 pages.

Holm, Ragner, "Electric Contacts Theory and Application," Springer–Verlag New York, Inc., New York, 1967, pp. 1–11, 26–31, 40–51, 164–175, and 366–375.

Colombo, "Wafer Back Surface Film Removal," Central R&D, SGS–Thomson Microelectronics, Agate Italy.

* cited by examiner

| Step # | Current (amps) | Time (sec) |
|---|---|---|
| 1 | $J_0*(1/n)*R^2*[1-(n-1)^2/n^2]^{1/2}$ | $t_1$ |
| 2 | $J_0*(1/n)*R^2*[1-(n-1)^2/n^2]^{1/2}$ | $t_0/2n$ |
| 3 | $J_0*(1/n)*R^2*\{[1-(n-1)^2/n^2]^{1/2} + [1-(n-2)^2/n^2]^{1/2}\}$ | $t_0/2n$ |
| 4 | $J_0*(1/n)*R^2*\{[1-(n-2)^2/n^2]^{1/2} + [1-(n-3)^2/n^2]^{1/2}\}$ | $t_0/2n$ |
| ... | | $t_0/2n$ |
| i | $J_0*A_i$ | $t_0/2n$ |
| ... | | $t_0/2n$ |
| 2n+1 | $J_0*3.14 = R^2$ | $t_0/2n+t$ |

FIG. 3

METHOD FOR REGULATING THE ELECTRICAL POWER APPLIED TO A SUBSTRATE DURING AN IMMERSION PROCESS

BACKGROUND OF THE INVENTION

1. Field of the Invention

Embodiments of the invention generally relate to systems for immersing a substrate in an electrolyte solution, and more particularly, to apparatuses and methods for controlling electrical power applied to a substrate during an immersion process.

2. Description of the Related Art

Metallization of sub-quarter micron sized features is a foundational technology for present and future generations of integrated circuit manufacturing processes. More particularly, in devices such as ultra large scale integration-type devices, i.e., devices having integrated circuits with more than a million logic gates, the multilevel interconnects that lie at the heart of these devices are generally formed by filling high aspect ratio interconnect features with a conductive material, such as copper or aluminum, for example. Conventionally, deposition techniques such as chemical vapor deposition (CVD) and physical vapor deposition (PVD), for example, have been used to fill these interconnect features. However, as interconnect sizes decrease and aspect ratios increase, void-free interconnect feature fill via conventional metallization techniques becomes increasingly difficult. As a result thereof, plating techniques, such as electrochemical plating (ECP) and electroless plating, for example, have emerged as viable processes for void free filling of sub-quarter micron sized high aspect ratio interconnect features in integrated circuit manufacturing processes.

In an ECP process, for example, sub-quarter micron sized high aspect ratio features formed into the surface of a substrate may be efficiently filled with a conductive material, such as copper, for example. ECP plating processes are generally two stage processes, wherein a seed layer is first formed over the surface features of the substrate, and then the surface features of the substrate are exposed to an electrolyte solution, while an electrical bias is simultaneously applied between the substrate and an anode positioned within the electrolyte solution. The electrolyte solution is generally rich in ions to be plated onto the surface of the substrate, and therefore, the application of the electrical bias causes these ions to be urged out of the electrolyte solution and to be plated onto the seed layer.

However, one challenge associated with ECP processes is that the plating solutions, which are generally acidic, may chemically etch the seed layer during the process of immersing the substrate in the plating solution. Inasmuch as seed layers are generally relatively thin conductive layers, the chemical etching that may take place during the immersion process may result in conductive discontinuities in the seed layer, which may cause plating irregularities in the subsequent plating processes. Therefore, in order to prevent chemical etching during the immersion process, conventional ECP plating systems apply an electrical loading bias to the substrate seed layer during the immersion process. The loading bias is generally configured to apply a cathodic bias to the substrate in order to prevent the chemical etching process and to cause at least some forward plating to occur. A conventional loading bias generally includes a constant voltage or current being applied to the substrate as the substrate is immersed in the plating solution in a tilt-type motion, i.e., one edge of the substrate is first immersed, and then a tilting motion is used to immerse the remaining portion of the substrate. This generally operates to urge bubbles that may form on the surface of the substrate toward the upper end of the substrate being tilted into the plating solution, and therefore, remove the bubbles from the surface, so that plating irregularities that may result from bubbles are minimized. However, as the surface of the substrate is immersed in the tilting motion under the constant load bias, the conductive area of the substrate being immersed is changing (increasing), and therefore, the resistance of the conductive path is also changing (decreasing). As a result of the changes in the current path during the immersion process, the current density applied across the surface of the substrate varies through the immersion process. Although the immersion process may only take a few seconds, the uniformity of the thin conductive seed layer may be affected by the varying current density applied across the surface of the seed layer, and therefore, the uniformity of layers subsequently plated over the seed layer may also be affected.

Therefore, there is a need for an apparatus and method for applying a loading bias to a substrate being immersed in a plating solution, wherein the method and apparatus provide a uniform current density across the surface of the substrate throughout the immersion process.

SUMMARY OF THE INVENTION

Embodiments of the invention generally provide a method and apparatus for providing a uniform current density across an immersed surface of a substrate during an immersion process. An embodiment of the method includes the steps of determining a time varying area of an immersed portion of the substrate during the immersion process, and supplying a time varying current to the substrate during the immersion process, wherein the time varying current is proportional to the time varying area and is configured to provide a constant current density to the immersed portion of the substrate.

Embodiments of the invention further provide a method for maintaining a loading bias having a constant current density during an immersion process. Embodiments generally include sensing a pivotal position of a lid member supporting a substrate during an immersion process, and determining a present total immersed area from the sensed pivotal position. The method can further include determining a load bias current that will generate the constant current density, and adjusting a current supplied to the substrate to correspond with the load bias current. Additionally, the steps of sensing, determining the current, determining the load bias, and adjusting can be at predetermined time intervals during the immersion process.

Embodiments of the invention further provide a method for maintaining a target current density across an immersed portion of a substrate surface. The methods generally include applying an initial current to the substrate surface as an immersion process initiates, the initial current being calculated to generate the target current density across the substrate surface, and pivotally immersing the substrate surface during an immersion duration. The method may further include determining a time varying immersed surface area of the substrate, and applying a time varying current to the immersed surface area of the substrate, wherein the time varying current is proportional to the time varying change in the immersed surface area and is calculated to maintain the target current density across the immersed portion of the substrate surface.

Embodiments of the invention may further provide an apparatus for plating metal onto substrates. The apparatuses generally include an electrolyte container, a lid member pivotally mounted proximate the electrolyte container, the lid member being configured to selectively support a substrate in fluid contact with electrolyte in the electrolyte container, and a power supply in electrical communication with the lid member and configured to supply an electrical bias to the substrate. The apparatus may further include a controller in electrical communication with the power supply, wherein the controller is configured to determine a time varying area of an immersed portion of the substrate during an immersion process, and supply a time varying current to the substrate during the immersion process, the time varying current being proportional to the time varying area and so that constant current density is maintained across the immersed portion of the substrate.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 3 illustrates an exemplary power supply processing recipe for a substrate immersion process of the invention.

DETAILED DESCRIPTION OF THE PREFERRED EMBODIMENT

The present invention generally provides an apparatus and method for controlling the voltage or current applied to a substrate being immersed in an electrolyte solution. The voltage or current may be controlled in a manner that provides a constant current density across the surface of the substrate as the area of the substrate contacting the electrolyte increases during the immersion process. The application of a constant current density to the substrate surface operates to prevent seed layer irregularities and/or discontinuities that may facilitate plating uniformity problems in subsequent processing steps.

Figure 1:
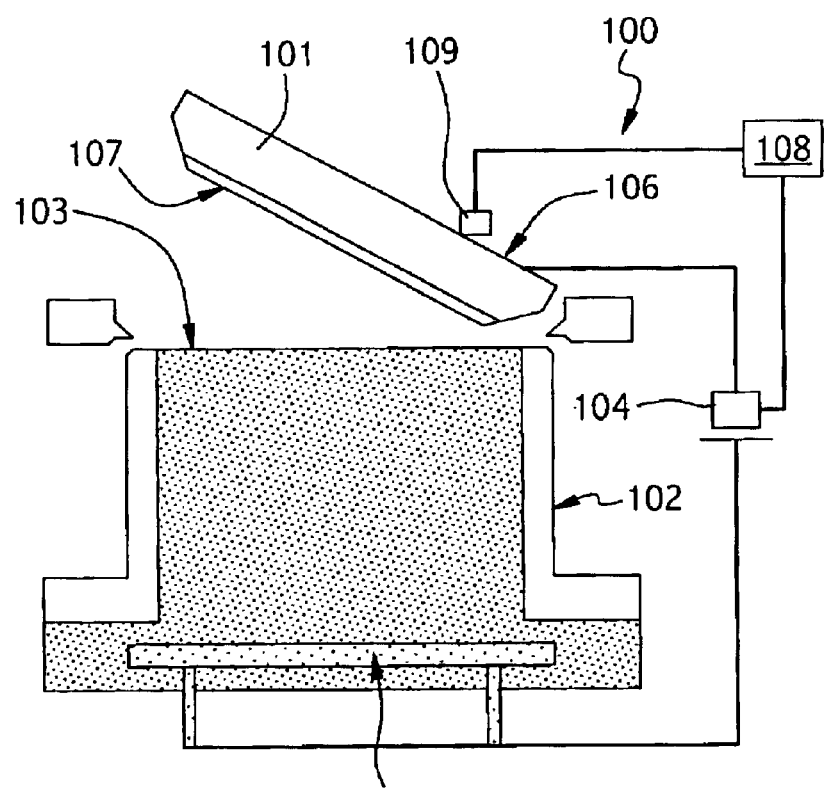
FIG. 1 illustrates a plating cell during a substrate immersion process of the invention.

FIG. 1 illustrates a plating cell 100 during a substrate immersion process of the invention. Plating cell 100 generally includes a cell body 102 configured to contain a fluid solution and an anode 105 therein. The cell body 102 generally includes an open top portion configured to receive a lid 101 therein. Lid 101 can generally be configured to support a substrate 107 in a face down position, i.e., a position where the working or processing side of the substrate is facing away from the lower side of lid 101. Additionally, lid 101 can be pivotally mounted about a pivot point 106, which allows the lid portion to pivot from a substrate loading position, i.e., a position where the lid is open and not in contact with the fluid solution in cell body 102, and a processing position, i.e., a closed position where the lower side of lid 101 is in contact with the fluid solution contained by cell body 102. A power supply 104 may be in electrical communication with the anode 105 and the substrate 107 via lid 101. Power supply 104 is configured to selectively apply a bias between the substrate 107 and the anode 107 sufficient to cause metal ions in the fluid solution contained in cell body 102 to be urged out of solution and to be plated on the substrate surface 107. The selective application of the electrical bias between the substrate 107 and the anode 105 by power supply 104 can be controlled by a system controller 108 in electrical communication with power supply 104. System controller 108, may, for example, be a microprocessor based controller configured to generate control signals for system 100 in accordance with a semiconductor processing recipe. System controller may be in electrical communication with a sensor 109 configured to sense the position of the lid 101 during the immersion process. For example, sensor 109 may be an optical sensor, a mechanical sensor, or other type of sensor configured to determine the position of lid 101 during the immersion or tilting process. The determined position may be communicated system controller 108 for use in determining processing parameter control signals.

In operation, plating cell 102, such as an electrochemical plating (ECP) cell, for example, is configured to plate metal, such as copper or aluminum, onto a substrate. With lid 101 in an open position, a substrate to be plated is positioned on the lower side of lid 101. Once the substrate is positioned, a loading bias is applied to the substrate by power supply 104 and lid 101 is pivoted so that the substrate becomes immersed in the electrolyte solution 103. However, during the immersion process, the loading bias is controlled by controller 108 to maintain a constant current density across the surface of the substrate throughout the immersion process. More particularly, controller 108 operates to provide a time varying control of the output of power supply 104 so that the current supplied to the substrate can be varied as the substrate becomes immersed in the electrolyte solution. The variance in the current provided by power supply 104 is configured to provide a constant current density over the area of the substrate being immersed in the electrolyte solution, even though the area of the substrate being immersed in the electrolyte solution is continually increasing as lid 101 pivots into contact with the electrolyte solution. The load bias can be applied to the substrate surface immediately before the immersion process initiates and terminates immediately before the plating bias is applied to the substrate.

Figure 2:
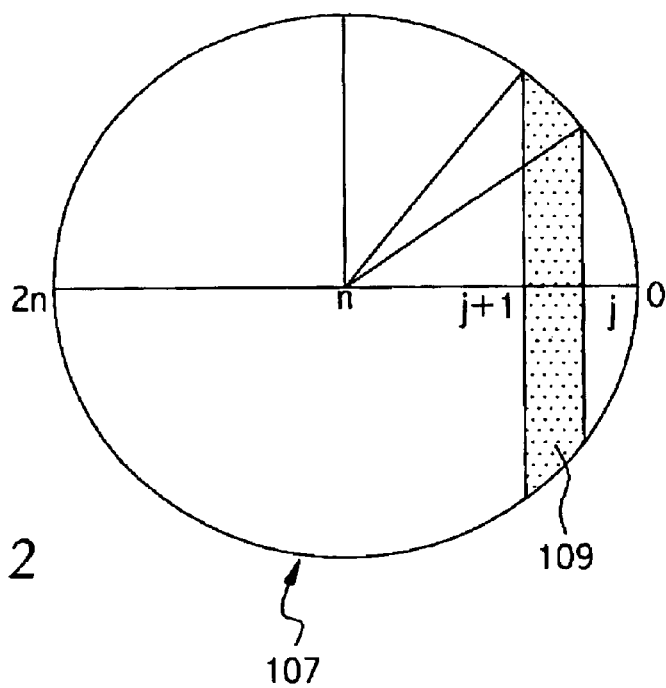
FIG. 2 illustrates an exemplary substrate surface during an immersion process of the invention.

FIG. 2 illustrates a diagram of a substrate surface as the substrate surface is being immersed into electrolyte solution. In this embodiment, substrate 107 begins the immersion as lid 101 begins to pivot toward the electrolyte solution 103 by first contacting the electrolyte solution 103 at a first edge 108 of substrate 107. As the pivotal motion of lid 101 continues, the area of the substrate immersed in the electrolyte solution 103 proportionally increases, as illustrated by the shaded area 109. It is to be noted, however, that the shaded area 109 does not represent the total immersed area. Rather, area 109 generally represents the most recently immersed area, and therefore, the area from the edge of the substrate to the line labeled j+1 would represent the total immersed area of the substrate at time J+1. Therefore, and in order for power supply 104 to provide a constant current density across the surface of substrate 107 during the immersion process, the time varying area of the substrate being immersed is calculated, or otherwise estimated or determined, and used to determine a time varying current necessary to provide a constant current density across the area of the substrate immersed in the electrolyte solution 103. As such, embodiments of the present invention supply current to the substrate as a function of the immersion speed of the substrate, as the immersion speed of the substrate, i.e., the pivotal rate at which the substrate is immersed into the plating solution, directly corresponds to the change of the immersed area of the substrate during the immersion process. Additionally, although the substrate is generally rotated during the immersion process, the area calculation will be unchanged in non-rotation embodiments, as the rotation of the substrate does not increase or decrease the area of the substrate being immersed in the plating solution per unit time.

The calculation of the time varying area of the substrate immersed in the electrolyte solution generally includes incrementally calculating the area of minute sections of the immersed portion of the substrate and summing the sections together to obtain the total area immersed for a particular time. The size of the minute sections may be determined by the user. If greater accuracy is desired, then the size of the individual sections should be smaller, and conversely, if larger sized sections are used, then the measurement will be less accurate. Therefore, as the immersed area increases, additional incremental sections of area may be added to the previous total area calculated to obtain the current total area immersed. Referring to FIG. 2, the area of a section of the substrate immersed in the electrolyte solution may be calculated by the following equation:

$$\text{Section\_Area} = \frac{2}{2} \cdot (R_{j+1} + R_j) \cdot \frac{R}{n}, \tag{1}$$

wherein R/n represents the width of the sectional area to be calculated, 2n represents the total number of sections to be calculated in the immersion process, j represents the previous section, j+1 represents the current section being calculated, and R represents the radius of the substrate being immersed, as illustrated in FIG. 2. The calculation of equation (1) may be conducted for each j that is less than the total number of sections 2n. Therefore, using simple algebraic manipulations, the area of the previous section may be represented by the equation:

$$\text{Area\_previous}(R_j) = R \cdot \left[1 - \left(\frac{n-j}{n}\right)^2\right]^{\frac{1}{2}}, \tag{2}$$

and therefore, the area of the current section may be represented by the equation:

$$\text{Area\_current}\left(R_{j+1} = R\left[1 - \frac{n-j-1}{n^2}\right]^{\frac{1}{2}}\right). \tag{3}$$

Therefore, for example, the current supplied to the substrate during the initial stage of the immersion process, i.e., during the stage where the area immersed in the electrolyte solution corresponds to $R_j$, may be calculated by multiplying the area of section $R_j$ by the desired current density. As the immersion process continues, the area increases, and therefore, the area used to calculate the current to be supplied to the immersed area in order to generate the desired current density also increases. However, the calculation process generally remains the same, except for the fact that the area used to calculate the current supplied to generate the desired current density changes in accordance with the area calculations. As such, the process for providing a uniform current density across the surface of the substrate during the immersion process generally becomes a process of increasing the current supplied to the substrate proportionally to the increase in the immersed area of the substrate, so that the current per unit of immersed area of the substrate remains constant.

Therefore, for example, assuming that the desired current density during the immersion process is represented by $J_0$, then the current supplied to the substrate may be represented by the equation:

$$I_j = J_0 \cdot A_j \tag{4},$$

wherein, $I_j$ represents the current supplied to the substrate at time j and $A_j$ represents the area immersed at time j. Using equation (4), when j is less than or equal to the total time, i.e., when the substrate is in the immersion process, then the area $A_j$ may be calculated by the equation:

$$A_j = \left(\frac{1}{n}\right) \cdot R^2 \cdot \sum_1^j \left[\frac{1-(n-1)^2}{n^2}\right]^{\frac{1}{2}}. \tag{5}$$

When j is greater than n, which represents the situation where over half of the substrate is immersed, as illustrated in FIG. 2, then the area $A_j$ may be calculated by the following equation:

$$A_j = \frac{1}{2} \cdot \pi \cdot R^2 + \left(\frac{1}{n}\right) \cdot R^2 \cdot \sum_n^j \left[\frac{1-(n-1)^2}{n^2}\right]^{\frac{1}{2}}. \tag{6}$$

FIG. 3 illustrates an exemplary power supply processing recipe for an immersion process of the invention. The processing recipe begins at step 1, i.e., where j=1, which corresponds to an initial time period in the substrate immersion process represented by time $t_0$. At j=1, the time will be $t_0/2n$, and the current supplied to the substrate ($I_j$) will correspond to the equation:

$$I_1 = J_0 \cdot \frac{1}{n} \cdot R^2 \cdot \left[\frac{1-(n-1)^2}{n^2}\right]^{\frac{1}{2}}, \tag{7}$$

where at the initial step, ie., where n=1, $I_1$ will equal a small initial current. The total time it takes from the substrate initially touching the plating solution until the time when the substrate surface is fully immersed in the plating solution is represented by $t_0$. Inasmuch when j=1 corresponds to the point where the substrate is initially immersed in the solution, it corresponds that the current supplied to the substrate will be the initial current. However, as the immersion process continues, the immersed area increases, and therefore, the current supplied to the substrate must also increase if the current density across the surface of the substrate is to remain constant. For example, at step 2, which generally corresponds to j=2, the current supplied to the immersed area may be represented by the equation:

$$I_2 = J_0 \cdot \frac{1}{n} \cdot R^2 \cdot \left\{\left[\frac{1-(n-1)^2}{n^2}\right]^{\frac{1}{2}} + \left[\frac{1-(n-2)^2}{n^2}\right]^{\frac{1}{2}}\right\}. \tag{8}$$

Similarly, at step j=3, the current supplied to the immersed area may be represented by the equation:

$$I_3 = \qquad (9)$$

$$J_0 \cdot \frac{1}{n} \cdot R^2 \cdot \left\{ \left[ \frac{1-(n-1)^2}{n^2} \right]^{\frac{1}{2}} + \left[ \frac{1-(n-2)^2}{n^2} \right]^{\frac{1}{2}} + \left[ \frac{1-(n-3)^2}{n^2} \right]^{\frac{1}{2}} \right\}.$$

When the step increment reaches j, then the current supplied to the immersed portion of the substrate is equal to the total current density ($J_0$). Additionally, as illustrated in FIG. 3, when the number of steps (j) reaches $2n$, the current density supplied to the immersed portion of the substrate is equal to the total current density ($J_0$), which, assuming that a circular substrate is being plated, will be the area of immersion ($\pi$ multiplied by the radius of the substrate squared ($\pi r_2$)), multiplied by the total current supplied to the substrate. Furthermore, inasmuch as this time period corresponds to when the substrate is fully immersed, the current supplied to the substrate may remain constant from this point until the plating process initiates, as the area of immersion will no longer change/increase.

In one embodiment of the invention, the current supplied to the substrate is increased as the immersion surface area increases in accordance with a time calculation. For example, the total time for an immersion process can be determined through experimentation. Thereafter, a correlation between the elapsed time in the immersion process and the immersed surface area can be determined through calculation. As such, with the correlation between the elapsed time and immersion area determined, the current and supply to the substrate can then be determined in accordance with the increase in the immersion time, as the time is proportional to the immersion area. Therefore, knowing the correlation between the immersion time and the immersion surface area, processing recipes can be modified to include a proportional change in the current supplied to the substrate during the immersion process so that a uniform current density across the immersed surface area can be maintained throughout the immersion process.

In another embodiment of the invention, sensor 109 is used to determine the exact radial or tilting position of lid 101 during the immersion process. As such, a position of lid 101 is transmitted to controller 108, which may then calculate the immersed area in a real-time manner. The calculated, immersed area may then be used to determine the current to be supplied to the substrate in order to maintain a uniform current density across the immersed substrate area. The granularity/incremental section sampling of the measurement process may be increased simply by taking more measurements per unit time, and therefore, adjusting the current supplied to the immersed surface area more per unit time. Although the end result of the present embodiment is to provide a uniform current density across the immersed surface area of the substrate, the present embodiment also provides for a uniform current density across the immersed area of the substrate during nonuniform immersion processes. For example, if the immersion speed of lid 101 is not constant or is not repeatable between respective immersion processes, the present embodiment may be utilized to maintain a uniform current density across the immersed area of the substrate regardless of the immersion speed, as the current calculation is independent of the elapsed immersion time. Therefore, the feedback loop type system of the present embodiment may provide advantages over other embodiments of the invention in specific configurations wherein the elapsed time of the immersion process is not constant across several substrate immersions.

In another embodiment of the invention, the method for maintaining a uniform current density across the surface of the substrate is utilized during the process of removing a substrate from a plating cell. For example, once a plating process for a substrate is complete, the substrate is removed from the plating chamber be reversing the steps of the immersion process. In the reverse immersion process, it may be desirable to maintain a constant current density across the immersed surface of the substrate in order to avoid variances in uniformity, in similar fashion to the constant current density maintained during the immersion process. Therefore, in the reverse immersion process, the current supplied to the substrate may be decreased as the immersed area of the substrate decreases, so that a uniform current density across the immersed area of the substrate may be maintained. The process of controlling the current to the substrate during the reverse immersion process is, for example, conducted to a feedback loop type system or a time varying current control type system, as discussed in the previous embodiments. Regardless of the type of current control system implemented, the current supplied to the substrate during the reverse immersion process will generally be proportional to the surface area of the substrate remaining immersed in the plating solution.

Figure 4:
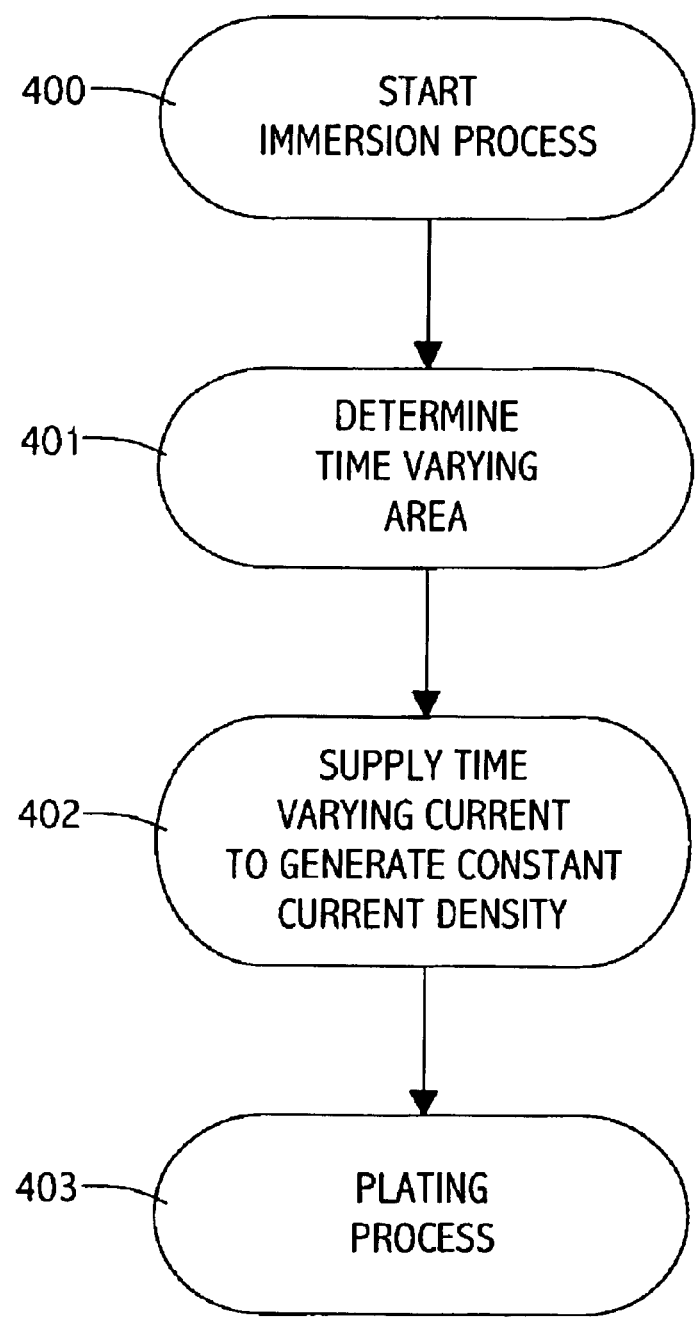
FIG. 4 illustrates a flowchart of an exemplary process of the invention.

FIG. 4 illustrates a flowchart of an exemplary method of the invention. The method generally begins at step 400, where the substrate immersion process is initiated. Once the immersion process begins, the method continues to step 401, where the time varying area of an immersed portion of the substrate during the immersion process is determined. The determination of the time varying area can be undertaken in one of several ways. For example, the pivotal position of the substrate support member may be sensed by a position sensor, and the immersed area of the substrate may be calculated from the sensed position. Alternatively, the lid may be pivoted in the same manner during every immersion process, and therefore, the immersion area may be observed as a function of the elapsed time of the immersion process. Regardless of the method employed to determine the immersed area, thereafter, at step 402, the method supplies a time varying current to the substrate during the immersion process, wherein the time varying current supplied to the substrate is proportional to the time varying area, and therefore, provides a constant current density across the immersed portion of the substrate. The steps may then be repeated at predetermined time intervals within the immersion process so that the current density across the immersed portion of the substrate is maintained generally constant, i.e., within a narrow range.

While the foregoing is directed to embodiments of the present invention, other and further embodiments of the invention may be devised without departing from the basic scope thereof, and the scope thereof is determined by the claims that follow.

What is claimed is:

1. A method for providing a uniform current density across an immersed surface of a substrate during an immersion process, comprising:

determining a time varying area of an immersed portion of the substrate during the immersion process; and supplying a time varying current to the substrate during the immersion process, wherein the time varying current is proportional to the time varying area and is configured to provide a constant current density to the immersed portion of the substrate.

2. The method of claim 1, wherein determining the time varying area comprises:

incrementally calculating the area of sections of the substrate as the sections become immersed; and summing the incrementally calculated section areas to determine a total immersed area for a particular time.

3. The method of claim 1, wherein supplying a time varying current comprises supplying a current to the substrate, the supplied current being equal to the constant density multiplied by the time varying area of the immersed portion of the substrate.

4. The method of claim 1, wherein the determination of a time varying area is correlated with a time varying pivotal position of a lid member of a plating system, wherein the lid member is configured to support the substrate during the immersion process.

5. The method of claim 4, wherein the time varying pivotal position is used to determine the time varying current.

6. The method of claim 1, wherein the time varying current is increased proportionally to an increase in the time varying area of the immersed portion.

7. The method of claim 1, wherein supplying a time varying current comprises selectively controlling a variable output power supply in electrical communication with the substrate, the selective control of the power supply being conducted by a system controller configured to execute a processing recipe.

8. The method of claim 1, wherein the time varying area is determined from a sensed pivotal position of a lid member configured to support the substrate during the immersion process.

9. The method of claim 1, wherein determining the time varying area comprises:

sensing a pivotal position of a lid member supporting the substrate during the immersion process; and calculating the immersed area of the substrate from the sensed pivotal position.

10. A method for maintaining a loading bias having a constant current density during an immersion process, comprising:

(a) sensing a pivotal position of a lid member supporting a substrate during an immersion process;

(b) determining a current total immersed area from the sensed pivotal position;

(c) determining a load bias current that will generate the constant current density;

(d) adjusting a current supplied to the substrate to correspond with the load bias current; and repeating step (a) through (d) at predetermined time intervals during the immersion process.

11. The method of claim 10, wherein determining the current total immersed area comprises:

calculating an area of a recently immersed section of the substrate; and adding the area of the recently immersed section to a previously calculated total immersed area to determine a current total immersed area.

12. The method of claim 11, wherein calculating the area of a recently immersed section comprises solving for sectional area in the following equation:

$$\text{Section\_Area} = \sum_{1}^{j} \frac{2}{2} \cdot (R_{j+1} + R_j) \cdot \frac{R}{n},$$

wherein j<n, and wherein the sectional area is represented by the following equation:

$$\text{Section\_Area} = \frac{1}{2}\pi r^2 + \frac{1}{n} r^2 \cdot \sum_{n}^{j}\left[\frac{1-(n-j)^2}{n^2}\right]^{\frac{1}{2}},$$

wherein j>n.

13. The method of claim 10, wherein determining a load bias current that will generate the constant current density comprises multiplying the current total immersed area by the constant current density.

14. The method of claim 10, wherein adjusting the current supplied to the substrate comprises increasing the current supplied to the substrate in proportion to an increase in the current total immersed area of the substrate.

15. The method of claim 14, wherein adjusting the current supplied to the substrate comprises solving the following equation:

$$I_1 = J_0 \cdot \frac{1}{n} \cdot R^2 \cdot \left[\frac{1-(n-1)^2}{n^2}\right]^{\frac{1}{2}},$$

wherein, $J_0$ represents the constant current density and wherein $$\frac{1}{n} \cdot R^2 \cdot \left[\frac{1-(n-1)^2}{n^2}\right]^{\frac{1}{2}}$$

represents the current total immersed area at an initial sampling interval.

16. The method of claim 14, wherein the sampling interval may be incremented to represent a time varying total immersed area.

17. The method of claim 15, wherein a second current total immersed area at a second sampling interval is represented by the equation $$\frac{1}{n} \cdot R^2 \cdot \left\{\left[\frac{1-(n-1)^2}{n^2}\right]^{\frac{1}{2}} + \left[\frac{1-(n-2)^2}{n^2}\right]^{\frac{1}{2}}\right\}.$$

18. The method of claim 17, wherein a third current total immersed area at a third sampling interval is represented by the equation $$\frac{1}{n} \cdot R^2 \cdot \left\{\left[\frac{1-(n-1)^2}{n^2}\right]^{\frac{1}{2}} + \left[\frac{1-(n-2)^2}{n^2}\right]^{\frac{1}{2}} + \left[\frac{1-(n-3)^2}{n^2}\right]^{\frac{1}{2}}\right\}.$$

19. A method for maintaining a target current density across an immersed portion of a substrate surface, comprising:

applying an initial current to the substrate surface as an immersion process initiates, the initial current being calculated to generate the target current density across the substrate surface;

pivotally immersing the substrate surface during an immersion duration;

determining a time varying immersed surface area of the substrate; and applying a time varying current to the immersed surface area of the substrate, wherein the time varying current is proportional to the time varying change in the immersed surface area and is calculated to maintain the target current density across the immersed portion of the substrate surface.

20. The method of claim 19, wherein determining the time varying immersed surface area comprises:
   calculating an area of a recently immersed section; and
   adding the area of the recently immersed section to a previous total immersed surface area to generate a time varying immersed surface area.

21. The method of claim 20, wherein calculating an area of the recently immersed section comprises solving the equation:

$$\text{recently\_immersed\_section} = (R_{j+1} + R_j) \cdot \frac{R}{n}.$$

22. The method of claim 21, wherein $R_j$ and $R_{j+1}$ are determined from a pivotal position of a lid member configured to support the substrate during the immersion process.

23. The method of claim 22, wherein the determination of $R_j$ and $R_{j+1}$ further comprises sensing a pivotal position of the lid member with a sensing device and calculating $R_j$ and $R_{j+1}$ from the sensed position.

24. The method of claim 22, wherein $R_j$ and $R_{j+1}$ are determined from an elapsed time of the immersion process.

25. The method of claim 23, further comprising:
   determining a total elapsed time for an immersion process; and
   determining $R_j$ and $R_{j+1}$ from a proportion of a current immersion time in to the total elapsed time for the immersion process.

26. The method of claim 19, wherein applying the time varying current to the immersed surface area of the substrate further comprises using a feedback loop-type control system to maintain the target current density across an immersed portion of a substrate surface.

27. The method of claim 19, wherein applying the time varying current to the immersed surface area of the substrate further comprises increasing the time varying current in proportion to the time varying immersed surface area of the substrate.

28. The method of claim 19, wherein applying the time varying current further comprises increasing the time varying current in proportion to pivotal movement of a lid member supporting the substrate in the immersion process.

29. The method of claim 19, wherein the applying step is conducted by a power supply in electrical communication with a controller, wherein the controller is configured to regulate the output of the power supply in accordance with a predetermined timing sequence from a semiconductor processing recipe.

30. The method of claim 19, wherein the applying step is conducted by a power supply in electrical communication with a controller, wherein the controller is configured to regulate the output of the power supply in accordance with a sensed position of a lid member supporting the substrate in the immersion process.

31. A method for controlling the current density across an immersed surface of a substrate during an immersion process, comprising:
   determining a time varying area of an immersed portion of the substrate during the immersion process; and
   supplying a time varying current to the substrate during the immersion process, wherein the time varying current is proportional to the time varying area, is configured to provide a constant current density to the immersed portion of the substrate, and correlates with a time varying position of the substrate relative to a fluid body within which the substrate is being immersed during the immersion process.

32. The method of claim 31, wherein the time varying position is used to determine the time varying current.

33. The method of claim 31, wherein the time varying current is increased proportionally to an increase in the time varying area of the immersed portion.

34. A method for maintaining a target current density across an immersed portion of a substrate surface during an immersion process, comprising:
   applying an initial current to the substrate surface as an immersion process initiates, the initial current being calculated to generate the target current density across the substrate surface;
   immersing the substrate surface during an immersion duration;
   determining a time varying immersed surface area of the substrate during the immersion duration; and
   applying a time varying current to the immersed surface area of the substrate, wherein the time varying current is proportional to a time varying change in the immersed surface area and is calculated to maintain the target current density across the immersed portion of the substrate surface by increasing the time varying current in proportion to the time varying immersed surface area of the substrate.

35. The method of claim 34, wherein applying the time varying current further comprises increasing the time varying current in proportion to pivotal movement of a lid member supporting the substrate in the immersion process.

* * * * *